(12) United States Patent
Pu

(10) Patent No.: US 7,247,934 B2
(45) Date of Patent: Jul. 24, 2007

(54) MULTI-CHIP SEMICONDUCTOR PACKAGE

(75) Inventor: Han-Ping Pu, Taichung Hsien (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 11/026,933

(22) Filed: Dec. 29, 2004

(65) Prior Publication Data

US 2006/0102994 A1 May 18, 2006

(30) Foreign Application Priority Data

Nov. 16, 2004 (TW) .............................. 93135023 A

(51) Int. Cl.
*H01L 23/48* (2006.01)
*H01L 23/52* (2006.01)

(52) U.S. Cl. .............................. 257/686; 257/E25.013; 257/E25.023; 257/777; 257/723; 257/685; 257/684; 257/786; 257/787; 257/788; 257/789; 257/790; 257/737; 257/738; 257/693; 257/666; 257/696; 257/698; 257/712

(58) Field of Classification Search ........ 257/E25.013, 257/E25.023, 684–686, 777, 723, 786–790, 257/734, 737, 738, 692, 693, 666, 698, 696, 257/675, 712, 713, 717, 720
See application file for complete search history.

(56) References Cited

U.S. PATENT DOCUMENTS

| | | | |
|---|---|---|---|
| 5,406,119 A * | 4/1995 | Numada | 257/692 |
| 5,696,031 A | 12/1997 | Wark | |
| 5,973,403 A | 10/1999 | Wark | |
| 6,157,080 A * | 12/2000 | Tamaki et al. | 257/738 |
| 6,521,483 B1 * | 2/2003 | Hashimoto | 438/110 |
| 6,607,937 B1 * | 8/2003 | Corisis | 438/108 |
| 6,621,156 B2 * | 9/2003 | Kimura | 257/686 |
| 6,707,680 B2 * | 3/2004 | Schaper | 361/760 |
| 6,737,738 B2 * | 5/2004 | Koh et al. | 257/686 |
| 6,784,023 B2 * | 8/2004 | Ball | 438/113 |
| 6,875,332 B2 * | 4/2005 | Ishiyama | 205/103 |
| 6,919,631 B1 * | 7/2005 | Hoffman et al. | 257/707 |
| 2002/0031865 A1 * | 3/2002 | Chen et al. | 438/123 |
| 2005/0051875 A1 * | 3/2005 | Ichikawa | 257/666 |

FOREIGN PATENT DOCUMENTS

JP 4-114455 * 4/1992

* cited by examiner

*Primary Examiner*—Alexander Oscar Williams
(74) *Attorney, Agent, or Firm*—Peter F. Corless; Steven M. Jensen; Edwards Angell Palmer & Dodge LLP

(57) ABSTRACT

A multi-chip semiconductor package and a fabrication method thereof are provided. At least one first chip is mounted on and electrically connected to an upper surface of a substrate via solder bumps. A preformed package structure having a second chip and a first encapsulation body is mounted on the upper surface of the substrate, wherein outer leads of the preformed package structure are exposed from the first encapsulation body and electrically connected to the upper surface of the substrate. The first encapsulation body, outer leads and substrate form a space where the first chip is received, and a gap is present between the first chip and the first encapsulation body. A second encapsulation body is formed on the upper surface of the substrate to encapsulate the first chip, solder bumps and preformed package structure. A plurality of solder balls are implanted on the lower surface of the substrate.

6 Claims, 5 Drawing Sheets

MULTI-CHIP SEMICONDUCTOR PACKAGE

FIELD OF THE INVENTION

The present invention relates to multi-chip semiconductor packages and fabrication methods thereof, and more particularly, to a multi-chip semiconductor package with a packaged chip and a flip chip being incorporated on a substrate, and a method of fabricating the semiconductor package.

BACKGROUND OF THE INVENTION

In accordance with electronic products being developed with compact size, light weight and high efficiency, semiconductor packages have been correspondingly reduced in profile and preferably incorporated with multiple chips to be suitable for use with the electronic products. Such structure with multiple semiconductor chips being mounted in a single package is customarily referred to as a multi-chip semiconductor package, wherein the multiple chips can be vertically stacked on a chip carrier (such as a substrate or lead frame) or individually attached to the substrate. The multi-chip package structure has a primary advantage for providing the semiconductor package with effectively enhanced or multiplied electrical and operational performances, making it suitably used in the highly efficient electronic product.

U.S. Pat. Nos. 5,696,031 and 5,973,403 have disclosed a multi-chip semiconductor package. Referring to FIG. 5, in this semiconductor package, a first chip 21 is mounted on a surface of a substrate 20 in a flip-chip manner that an active surface 210 of the first chip 21 faces downwards and is electrically connected to the substrate 20 via a plurality of solder bumps 22. Then, a second chip 23 is attached to a non-active surface 211 of the first chip 21 and is electrically connected to the substrate 20 via a plurality of bonding wires 24. An encapsulation body 25 is formed on the substrate 20 to encapsulate the first chip 21, second chip 23 and bonding wires 24. Finally, a plurality of solder balls 26 are implanted on an opposite surface of the substrate 20. This completes fabrication of the multi-chip semiconductor package. Since the wire-bonding process performed on the second chip 23 would generate shocks that may cause cracks of the solder bumps 22, an underfill process is carried out between the first chip 21 and the substrate 20 to fill an insulating material (such as a resin material, etc.) in gaps between the adjacent solder bumps 22, so as to enhance the mechanical strength of the solder bumps 22 and prevent them from cracks due to the shocks generated by the wire-bonding process.

However, during the underfill process for the above semiconductor package, the procedure of filling the insulating material may easily contaminate predetermined positions (such as bond fingers) on the substrate for connecting the bonding wires, and the bonding wires cannot be firmly bonded to the contaminated bond fingers, such that the yield of the wire-bonding process and the quality of electrical connection between the second chip and the substrate would be degraded, and the reliability of the entire semiconductor package is thus deteriorated. Moreover, for the second chip that is electrically connected to the substrate via the bonding wires, since the second chip is directly incorporated in the semiconductor package with the quality and yield of the second chip being unknown, a known good die (KGD) issue is produced. In other words, if the second chip not passing a burn-in test incurs quality defects, the entire package having such second chip would fail and the product yield is reduced.

U.S. Patent Publication No. 2004/0113275 has disclosed another multi-chip semiconductor package. As shown in FIG. 6, this semiconductor package allows a first chip 31 to be mounted on a surface of a substrate 30 in a flip-chip manner, wherein an active surface 310 of the first chip 31 faces downwards and is electrically connected to the substrate 30 via a plurality of solder bumps 32. An insulating material (such as a resin material, etc.) is filled in gaps between the adjacent solder bumps 32 using an underfill technique. Then, a land grid array (LGA) package structure 33 is attached to a non-active surface 311 of the first chip 31 in an inverted manner, and a substrate 330 of the LGA package structure 33 is electrically connected to the substrate 30 via a plurality of bonding wires 34. An encapsulation body 35 is formed on the substrate 30 to encapsulate the first chip 31, LGA package structure 33 and bonding wires 34. Finally, a plurality of solder balls 36 are implanted on an opposite surface of the substrate 30. This completes fabrication of the multi-chip semiconductor package.

Although the above fabrication method may solve the KGD problem, the multi-chip semiconductor package shown in FIG. 6 still have the similar drawback to that shown in FIG. 5. As the underfill process is required to fill the gaps between the adjacent solder bumps 32 with the insulating material so as to enhance the mechanical strength of the solder bumps 32 and prevent them from cracks due to shocks during the wire-bonding process, the procedure of filling the insulating material may easily contaminate predetermined positions (such as bond fingers) on the substrate 30 for connecting the bonding wires 34, and the bonding wires 34 cannot be firmly bonded to the contaminated bond fingers, thereby degrading the yield of the wire-bonding process and the quality of electrical connection between the LGA package structure 33 and the substrate 30, as well as deteriorating the reliability of the entire semiconductor package.

Therefore, the problem to be solved here is to provide a multi-chip semiconductor package, which can prevent predetermined positions for electrical connection on a substrate from contamination and eliminate a KGD issue so as to assure the reliability and yield of the semiconductor package.

SUMMARY OF THE INVENTION

In light of the above drawbacks in the prior art, an objective of the present invention is to provide a multi-chip semiconductor package and a fabrication method thereof, which do not require an underfill process, such that predetermined positions for electrical connection on a substrate can be prevented from contamination, and the electrical connection quality and reliability of the semiconductor package are assured.

Another objective of the present invention is to provide a multi-chip semiconductor package and a fabrication method thereof, wherein a preformed package structure passing a burn-in test is incorporated in the semiconductor package, such that a known good die (KGD) issue can be eliminated, and the reliability and yield of the semiconductor package are assured.

A further objective of the present invention is to provide a multi-chip semiconductor package and a fabrication method thereof, with a thermally conductive adhesive being applied between an upper packaged chip and a lower flip chip in the semiconductor package, such that heat generated by the upper chip can be transmitted to the lower chip and then to a substrate to be dissipated out of the semiconductor package, thereby effectively improving the heat dissipating efficiency of the semiconductor package.

In accordance with the above and other objectives, the present invention proposes a multi-chip semiconductor package, comprising a substrate having an upper surface and a lower surface opposed to the upper surface; at least one first chip having an active surface and a non-active surface, wherein the active surface of the first chip is mounted on and electrically connected to the upper surface of the substrate via a plurality of solder bumps; a preformed package structure comprising a lead frame, at least one second chip mounted on and electrically connected to the lead frame, and a first encapsulation body for encapsulating the second chip and a portion of the lead frame, wherein outer leads of the lead frame are exposed from the first encapsulation body and mounted on the upper surface of the substrate, such that the first encapsulation body, the exposed outer leads and the substrate form a space where the first chip is received, and a gap is present between the non-active surface of the first chip and the first encapsulation body; a second encapsulation body formed on the upper surface of the substrate to encapsulate the first chip, the solder bumps and the preformed package structure; and a plurality of solder balls implanted on the lower surface of the substrate.

The present invention also proposes a fabrication method of the above multi-chip semiconductor package, comprising the steps of: preparing a substrate having an upper surface and a lower surface opposed to the upper surface; providing at least one first chip having an active surface and a non-active surface, and allowing the active surface of the first chip to be mounted on and electrically connected to the upper surface of the substrate via a plurality of solder bumps; mounting a preformed package structure on the upper surface of the substrate, the preformed package structure comprising a lead frame, at least one second chip mounted on and electrically connected to the lead frame, and a first encapsulation body for encapsulating the second chip and a portion of the lead frame, wherein outer leads of the lead frame are exposed from the first encapsulation body and mounted on the upper surface of the substrate, such that the first encapsulation body, the exposed outer leads and the substrate form a space where the first chip is received, and a gap is present between the non-active surface of the first chip and the first encapsulation body; forming a second encapsulation body on the upper surface of the substrate to encapsulate the first chip, the solder bumps and the preformed package structure; and implanting a plurality of solder balls on the lower surface of the substrate.

The above multi-chip semiconductor package can also be fabricated by a batch method comprising the steps of: providing a substrate strip comprising a plurality of substrates and having an upper surface and a lower surface opposed to the upper surface; mounting at least one first chip on the upper surface of each of the substrates, the first chip having an active surface and a non-active surface, and allowing the active surface of the first chip to be mounted on and electrically connected to the upper surface of each of the substrates via a plurality of solder bumps; mounting a preformed package structure on the upper surface of each of the substrates, the preformed package structure comprising a lead frame, at least one second chip mounted on and electrically connected to the lead frame, and a first encapsulation body for encapsulating the second chip and a portion of the lead frame, wherein outer leads of the lead frame are exposed from the first encapsulation body and mounted on the upper surface of each of the substrates, such that the first encapsulation body, the exposed outer leads and the corresponding substrate form a space where the first chip is received, and a gap is present between the non-active surface of the first chip and the first encapsulation body; forming a second encapsulation body on the upper surface of the substrate strip to encapsulate all of the first chips, the solder bumps and the preformed package structures; implanting a plurality of solder balls on the lower surface of the substrate strip; and performing a singulation process to cut the second encapsulation body and the substrate strip so as to separate apart the plurality of substrates and form a plurality of individual semiconductor packages.

The second chip in the preformed package structure is electrically connected to the lead frame via a plurality of bonding wires. The lead frame comprises a die pad and a plurality of leads, wherein each of the leads is composed of an inner lead and an outer lead. The second chip is mounted on an upper surface of the die pad and electrically connected to the inner leads. The inner leads and the bonding wires are encapsulated by the first encapsulation body. In one preferred embodiment, the die pad is encapsulated by the first encapsulation body, and the gap between the first chip and the first encapsulation body is filled with the second encapsulation body. In another preferred embodiment, a lower surface of the die pad is exposed from the first encapsulation body and abuts against the gap between the first chip and the first encapsulation body, such that a thermally conductive adhesive is filled in the gap between the first chip and the first encapsulation body prior to fabrication of the second encapsulation body.

The above multi-chip semiconductor package and its fabrication methods allow a substrate to accommodate both a packaged chip and a flip chip. This is accomplished by firstly, electrically connecting a first chip in a flip-chip manner to the substrate via a plurality of solder bumps, and then mounting a preformed package structure on the substrate, wherein the preformed package structure is incorporated with a second chip and has exposed outer leads that are mounted and electrically connected to the substrate by surface mount technology (SMT), such that a first encapsulation body of the preformed package structure, the exposed outer leads and the substrate form a space where the first chip is received, and the first encapsulation body is supported above the first chip, with a gap being present between the first encapsulation body and the first chip. Since the preformed package structure is electrically connected to the substrate by the surface mount technology, the solder bumps located between the first chip and the substrate would not subject to cracks caused by shocks generated during a wire-bonding process in the prior art. Thus, an underfill process is not required in the present invention to fill gaps between the adjacent solder bumps located between the first chip and the substrate. On the other hand, in the present invention, a single molding process is carried out to form a second encapsulation body for encapsulating the first chip and the preformed package structure as well as filling the gap between the first encapsulation body and the first chip and the gaps between the adjacent solder bumps. This can prevent predetermined positions on the substrate for mounting the outer leads of the preformed package structure from contamination by the underfull process, and assure the preformed package structure to be well mounted and electrically connected to the substrate, such that the electrical connection quality and reliability of the entire semiconductor package would not be affected. Moreover, the fabricated preformed package structure before being mounted on the substrate is subjected to a burn-in test. Specifically, only the preformed package structure that has successfully passed the burn-in test would be mounted on the substrate. As a result, the preformed package structure would not contain a second chip that is defective or unknown with its quality, such that the conventional known good die (KGD) problem can be eliminated, and the reliability and yield of the entire semiconductor package are assured. Additionally, in another preferred embodiment of the present invention, a lead frame of the preformed package structure has a die pad exposed from the first encapsulation body, with a lower surface of the die pad abutting against the gap between the first encapsulation body and the first chip, and prior to fabricating the second encapsulation body, a thermally conductive adhesive is applied in the gap between the first encapsulation body and the first chip, such that heat generated by the second chip mounted on the die pad can be transmitted via the die pad and the thermally conductive adhesive to the first chip and then transmitted via the solder bumps and the substrate to be dissipated out of the semiconductor package. This thus effectively improves the heat dissipating efficiency of the entire semiconductor package. Furthermore, the semiconductor package in the present invention has a multi-chip structure containing at least the first and second chips, thereby providing the entire semiconductor package with enhanced electrical and operational performances.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Figure 1:
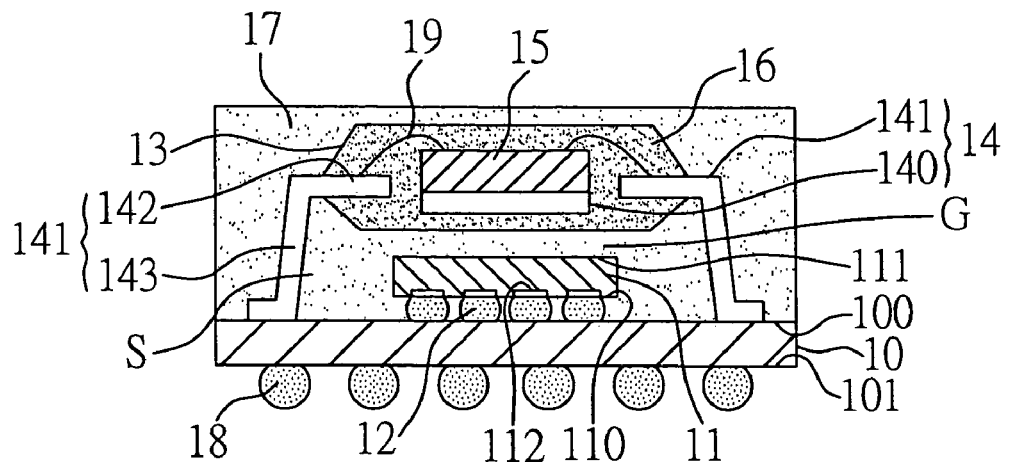
FIG. 1 is a cross-sectional view of a multi-chip semiconductor package according to a first preferred embodiment of the present invention.

As shown in FIG. 1, a multi-chip semiconductor package according to a first preferred embodiment of the present invention comprises a substrate 10 having an upper surface 100 and a lower surface 101 opposed to the upper surface 100; at least one first chip 11 mounted on and electrically connected to the upper surface 100 of the substrate 10 via a plurality of solder bumps 12 in a flip-chip manner; a preformed package structure 13 mounted on and electrically connected to the upper surface 100 of the substrate 10 via outer leads 143 exposed from a first encapsulation body 16 of the preformed package structure 13, wherein the first encapsulation body 16, the outer leads 143 and the substrate 10 form a space S where the first chip 11 is received, and a gap G is present between the first chip 11 and the first encapsulation body 16; a second encapsulation body 17 formed on the upper surface 100 of the substrate 10 to encapsulate the first chip 11, the solder bumps 12 and the preformed package structure 13 and fill the space S and the gap G; and a plurality of solder balls 18 implanted on the lower surface 101 of the substrate 10.

The substrate 10 can be a normal substrate having predetermined circuitry (not shown) to accommodate both the preformed package structure 13 and the first chip 11 (flip chip). The substrate 10 is primarily made of a resin material such as epoxy resin, polyimide resin, BT (bismaleimide triazine) resin or FR4 resin, etc.

The first chip 11 has an active surface 110 and a non-active surface 111 opposed to the active surface 110, wherein a plurality of electronic elements (not shown), electronic circuits (not shown) and bond pads 112 are disposed on the active surface 110. The bond pads 112 are bonded to the plurality of solder bumps 12 to allow the active surface 110 of the first chip 11 to be mounted on and electrically connected to the upper surface 100 of the substrate 10 via the solder bumps 12 in the flip-chip manner.

The preformed package structure 13 comprises a lead frame 14, at least one second chip 15 mounted on and electrically connected to the lead frame 14, and the first encapsulation body 16 for encapsulating the second chip 15 and a portion of the lead frame 14. The lead frame 14 includes a die pad 140 and a plurality of leads 141, wherein each of the leads 141 is composed of an inner lead 142 and an outer lead 143. The second chip 15 is mounted on the die pad 140 and is electrically connected to the inner leads 142 via a plurality of bonding wires 19. The die pad 140 and the inner leads 142 are encapsulated by the first encapsulation body 16.

Moreover, the first encapsulation body 16 can be made of a same or different conventional resin material as or from the second encapsulation body 17; for example, a commonly used resin material includes epoxy resm and the like.

The multi-chip semiconductor package shown in FIG. 1 can be fabricated by the procedural steps shown in FIGS. 2A to 2E.

Figure 2A:
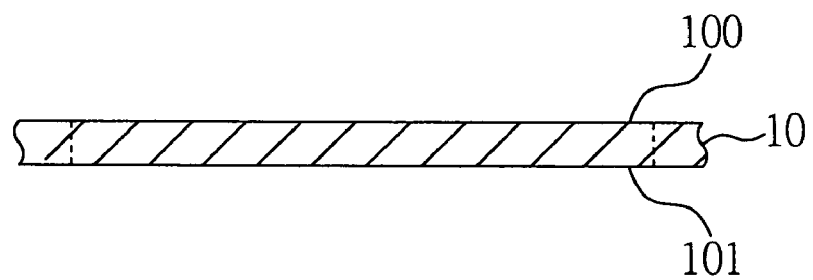
FIGS. 2A to 2E are schematic diagrams showing a set of steps of fabricating the semiconductor package in FIG. 1.

First referring to FIG. 2A, a substrate 10 is provided, which has an upper surface 100 and a lower surface 101 opposed to the upper surface 100. The substrate 10 can be a normal substrate having predetermined circuitry (not shown), and is primarily made of a resin material such as epoxy resin, polyimide resin, BT (bismaleimide triazine) resin or FR4 resin, etc. Since the structure and fabrication of the substrate are both known in the art, they are not to be further described here.

Figure 2B:
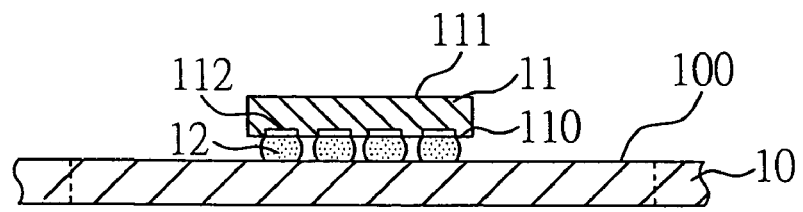

Referring to FIG. 2B, at least one first chip 11 is provided, which has an active surface 110 and a non-active surface 111 opposed to the active surface 110, wherein a plurality of electronic elements (not shown), electronic circuits (not shown) and bond pads 112 are disposed on the active surface 110. Next, a plurality of solder bumps 12 are formed on the bond pads 112 of the active surface 110 of the first chip 11. Then, the first chip 11 is mounted on the upper surface 100 of the substrate 10 in a flip-chip manner that the active surface 110 of the first chip 11 faces downwards and is electrically connected to the upper surface 100 of the substrate 10 via the plurality of solder bumps 12. The fabrication of the first chip and solder bumps is known in the art and thus not to be further detailed herein.

Figure 2C:
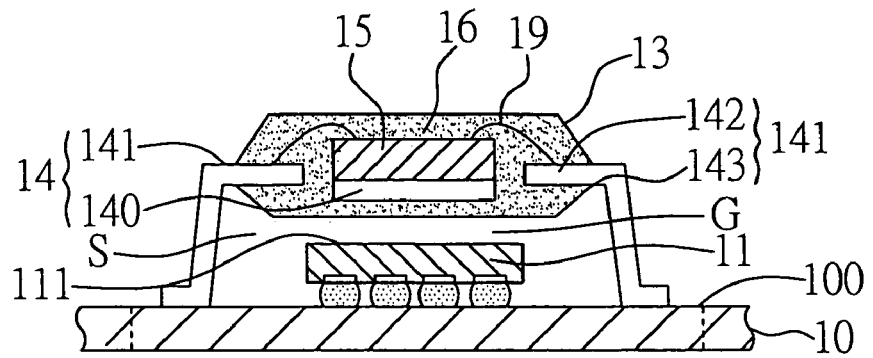

Referring to FIG. 2C, a preformed package structure 13 is mounted on the upper surface 100 of the substrate 10. The preformed package structure 13 can be a pre-fabricated lead-frame-based quad flat package (QFP) and successfully passes the conventional burn-in test. The preformed package structure 13 comprises a lead frame 14, at least one second chip 15 mounted on and electrically connected to the lead frame 14, and a first encapsulation body 16 for encapsulating the second chip 15 and a portion of the lead frame 14, wherein the first encapsulation body 16 is made of a conventional resin material such as epoxy resin, etc. The lead frame 14 includes a die pad 140 and a plurality of leads 141, wherein each of the leads 141 is composed of an inner lead 142 and an outer lead 143. The second chip 15 is mounted on an upper surface of the die pad 140 and is electrically connected to the inner leads 142 via a plurality of bonding wires 19. The die pad 140, the inner leads 142 and the bonding wires 19 are encapsulated by the first encapsulation body 16, with the outer leads 143 being exposed from the first encapsulation body 16. The exposed outer leads 143 are used to mount and electrically connect the preformed package structure 13 to the upper surface 100 of the substrate 10 via for example, surface mount technology (SMT), etc. As a result, the first encapsulation body 16 is supported above the first chip 11 and forms a space S together with the outer leads 143 and the substrate 10 to receive the first chip 11 therein, and a gap G is present between the first encapsulation body 16 and the non-active surface 111 of the first chip 11. The surface mount technology is known in the art and thus not to be further detailed herein.

Figure 2D:
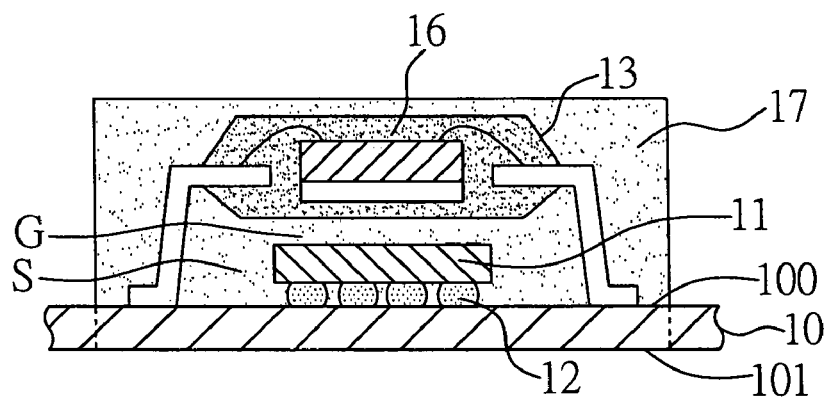

Referring to FIG. 2D, a molding process is performed using an encapsulation mold having an upper mold and a lower mold (not shown), wherein the upper mold is formed with a cavity, and the lower mold can be a flat mold. The substrate 10 mounted with the first chip 11 and the preformed package structure 13 thereon is placed in the encapsulation mold, wherein the first chip 11 and the preformed package structure 13 are received in the cavity of the upper mold, and the substrate 10 is clamped between the upper and lower molds, with the lower surface 101 of the substrate 10 abutting against the flat lower mold. Then, a conventional resin material (such as epoxy resin, etc.) is injected into the cavity of the upper mold to encapsulate the first chip 11, the solder bumps 12 and the preformed package structure 13 on the upper surface 100 of the substrate 10, and fill the space S, the gap G between the first chip 11 and the first encapsulation body 16, and gaps between the adjacent solder bumps 12. When the resin material is cured, the encapsulation mold can be removed from the substrate 10, such that a second encapsulation body 17 is formed on the upper surface 100 of the substrate 10. Since the lower surface 101 of the substrate 10 abuts against the flat lower mold during molding, no resin material or second encapsulation body 17 would be formed on the lower surface 101 of the substrate 10, and thus the lower surface 101 of the substrate 10 is exposed after the encapsulation mold is removed. The second encapsulation body 17 can be made of a same or different conventional resin material as or from the first encapsulation body 16.

Figure 2E:
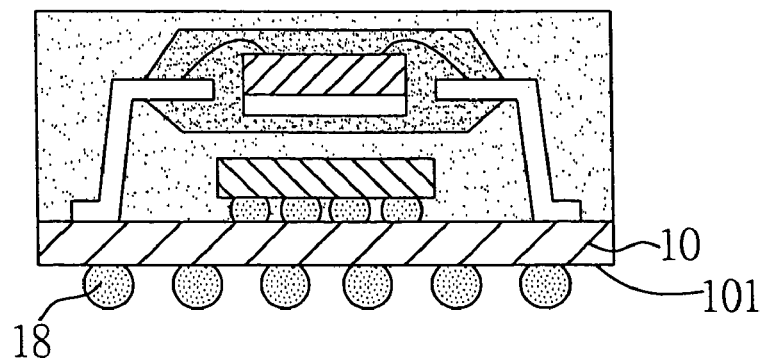

Finally, referring to FIG. 2E, a ball-implanting process is carried out to implant a plurality of solder balls 18 on the exposed lower surface 101 of the substrate 10. This thus completes fabrication of the multi-chip semiconductor package in the present invention. The solder balls 18 may serve as input/output (I/O) connections of the semiconductor package to be connected to an external device such as a printed circuit board (not shown), so as to establish an electrical connection between the semiconductor package and the external device via the solder balls 18. The ball-implanting process is known in the art and not to be further described herein.

In addition, the multi-chip semiconductor package shown in FIG. 1 can also be fabricated by a batch method with reference to FIGS. 3A to 3F.

Figure 3A:
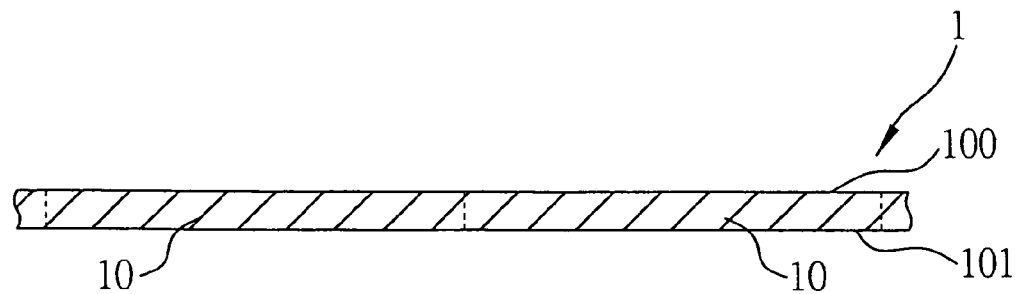
FIGS. 3A to 3F are schematic diagrams showing another set of steps of fabricating the semiconductor package in FIG. 1.

First referring to FIG. 3A, a substrate strip 1 is provided, which comprises a plurality of integrally formed substrates 10 and has an upper surface 100 and a lower surface 101 opposed to the upper surface 100, wherein the adjacent substrates 10 are bordered by dotted cutting lines shown in the drawing. The substrate strip 1 is formed with predetermined circuitry (not shown), and is primarily made of a resin material such as epoxy resin, polyimide resin, BT resin or FR4 resin, etc.

Figure 3B:
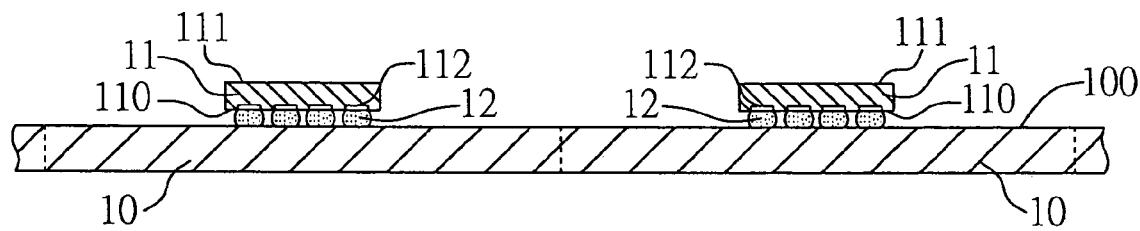

Referring to FIG. 3B, a plurality of first chips 11 are provided, each of the first chips 11 having an active surface 110 and a non-active surface 111, wherein a plurality of electronic elements (not shown), electronic circuits (not shown) and bond pads 112 are disposed on the active surface 110 of each of the first chips 11. Then, a plurality of solder bumps 12 are formed on the bond pads 112 of the active surface 110 of each of the first chips 11. Subsequently, at least one of the first chips 11 is mounted on the upper surface 100 of each of the substrates 10 in a flip-chip manner that the active surface 110 of the first chip 11 faces downwards and is electrically connected to the upper surface 100 of the corresponding substrate 10 via the solder bumps 12.

Figure 3C:
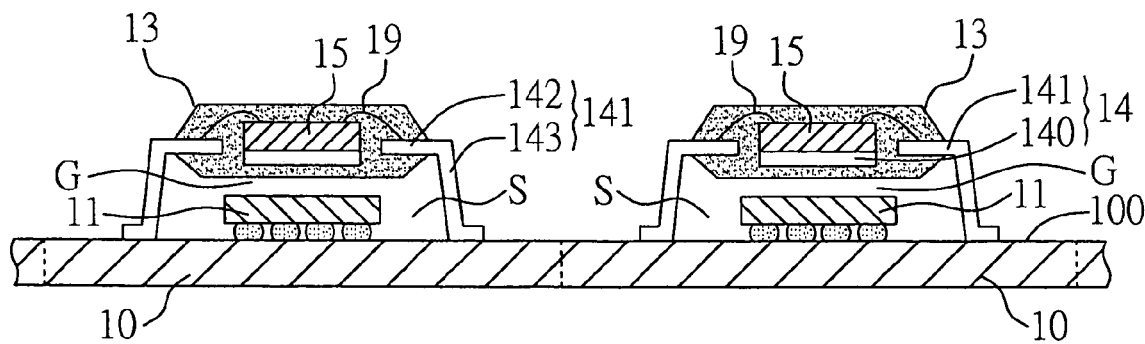

Referring to FIG. 3C, a preformed package structure 13 is mounted on the upper surface 100 of each of the substrates 10. The preformed package structure 13 can have a structure as that shown in FIG. 2C, comprising a lead frame 14, at least one second chip 15 mounted on and electrically connected to the lead frame 14, and a first encapsulation body 16 (made of a resin material such as epoxy resin, etc.) for encapsulating the second chip 15 and a portion of the lead frame 14. The lead frame 14 includes a die pad 140 and a plurality of leads 141, wherein each of the leads 141 is composed of an inner lead 142 and an outer lead 143. The second chip 15 is mounted on an upper surface of the die pad 140 and is electrically connected to the inner leads 142 via a plurality of bonding wires 19. The die pad 140, the inner leads 142 and the bonding wires 19 are encapsulated by the first encapsulation body 16, with the outer leads 143 being exposed from the first encapsulation body 16. The exposed outer leads 143 are used to mount and electrically connect the preformed package structure 13 to the upper surface 100 of each of the substrates 10 via for example, surface mount technology (SMT), etc. As a result, the first encapsulation body 16 of the preformed package structure 13 is supported above each of the first chips 11 and forms a space S together with the outer leads 143 and the corresponding substrate 10 to receive the corresponding first chip 11 therein, and a gap G is present between the first encapsulation body 16 and the non-active surface 111 of the corresponding first chip 11.

Figure 3D:
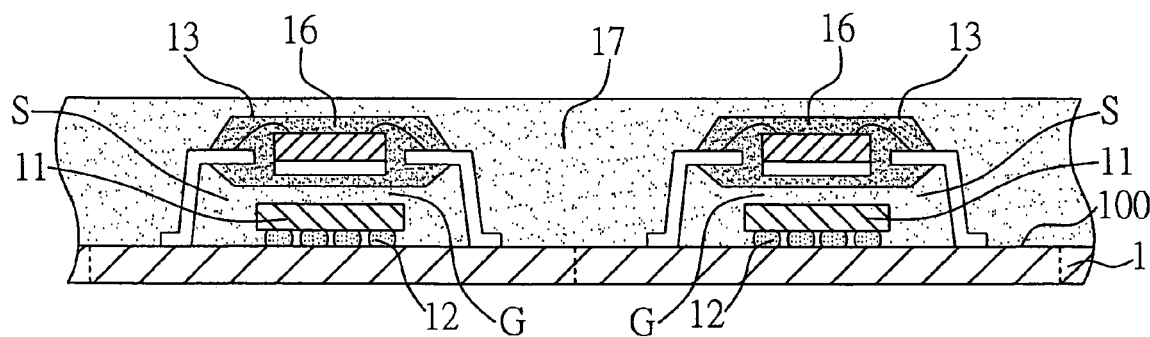

Referring to FIG. 3D, a molding process is performed to form a second encapsulation body 17 on the upper surface 100 of the substrate strip 1. First, the substrate strip 1 mounted with the plurality of first chips 11 and preformed package structures 13 is placed in an encapsulation mold (not shown), allowing the plurality of first chips 11 and preformed package structures 13 to be received in a cavity of the encapsulation mold. Then, a resin material (such as epoxy resin, etc.) is injected into the cavity to encapsulate all of the first chips 11, the solder bumps 12 and the preformed package structures 13, and fill all of the foregoing spaces S, the gaps between the first chips 11 and the first encapsulation bodies 16, and gaps between the adjacent solder bumps 12. When the resin material is cured, the encapsulation mold can be removed from the substrate strip 1, and thus the second encapsulation body 17 is completely fabricated. The second encapsulation body 17 can be made of a same or different conventional resin material as or from the first encapsulation body 16.

Figure 3E:
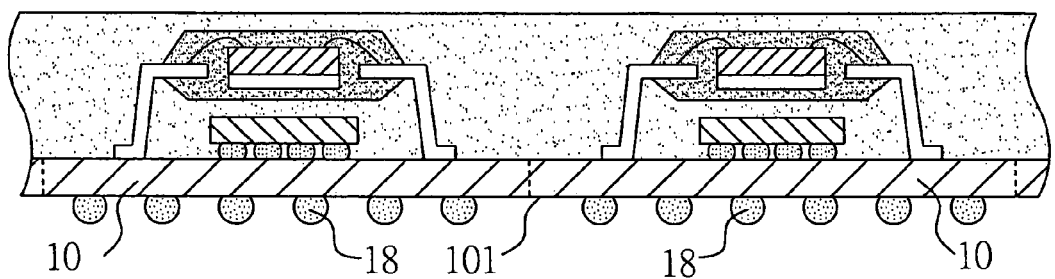

Subsequently, referring to FIG. 3E, a ball-implanting process is carried out to implant a plurality of solder balls 18 on the lower surface 101 of each of the substrates 10.

Figure 3F:
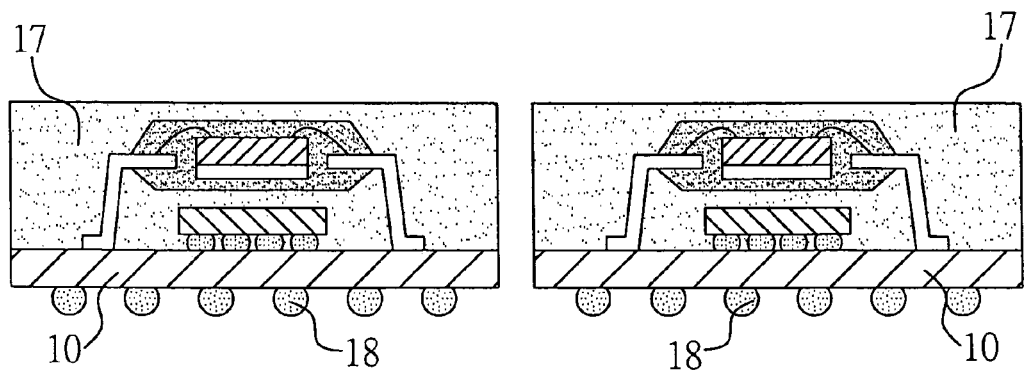

Finally, referring to FIG. 3F, a singulation process is performed to cut the substrate strip 1 and the second encapsulation body 17 along the cutting lines on the substrate strip 1, so as to separate apart the plurality of substrates 10 and form a plurality of individual semiconductor packages. The singulation process is known in the art and thus not to be further detailed herein. The singulated semiconductor packages each has the plurality of solder balls 18 that may serve as I/O connections of the corresponding semiconductor package to be electrically connected to an external device such as a printed circuit board (not shown), so as to establish an electrical connection between the semiconductor package and the external device via the solder balls 18.

Figure 4:
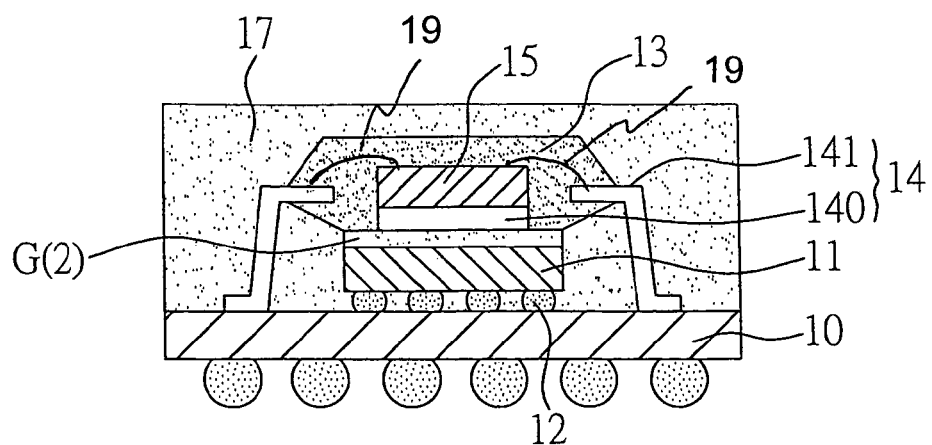
FIG. 4 is a cross-sectional view of a multi-chip semiconductor package according to a second preferred embodiment of the present invention.
Figure 5:
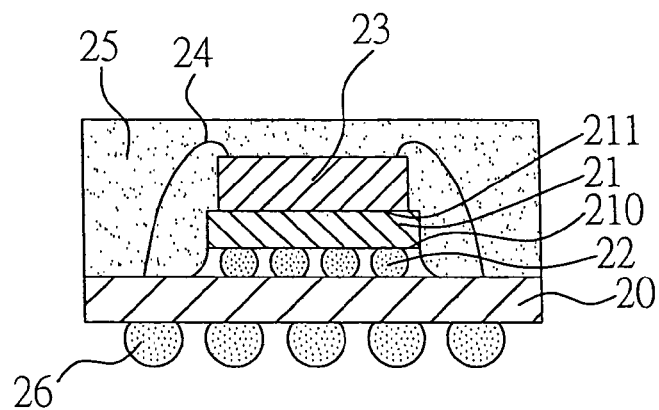
FIG. 5 (PRIOR ART) is a cross-sectional view of a conventional multi-chip semiconductor package.
Figure 6:
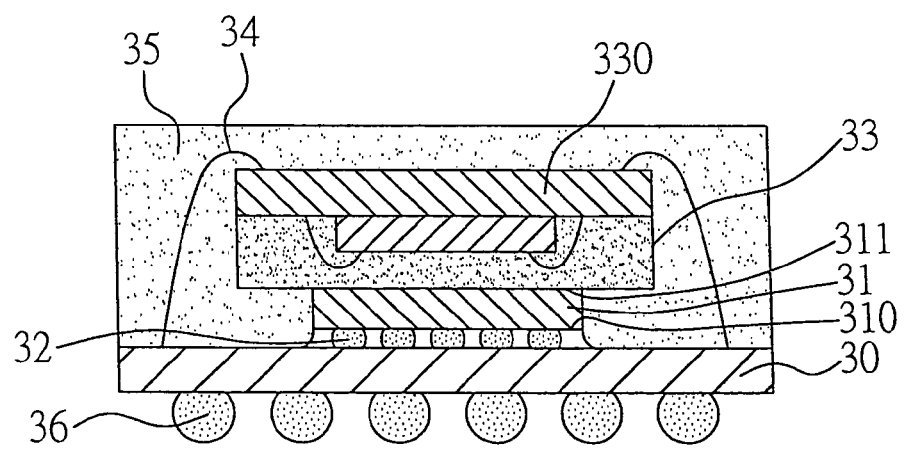
FIG. 6 (PRIOR ART) is a cross-sectional view of another conventional multi-chip semiconductor package.

FIG. 4 shows a multi-chip semiconductor package according to a second preferred embodiment of the present invention. As shown in FIG. 4, this semiconductor package differs from that of the above first embodiment in that the preformed package structure 13 is a lead-frame-based package with an exposed die pad. In particular, a lower surface of the die pad 140 of the lead frame 14 is exposed from the first encapsulation body 16 and is flush with the first encapsulation body 16. The exposed lower surface of the die pad 140 abuts against the gap G between the first chip 11 and the first encapsulation body 16. A thermally conductive adhesive 2, instead of the second encapsulation body 17 for encapsulating the first chip 11, is applied in the gap G. The thermally conductive adhesive 2 allows the preformed package structure 13 to be thermally connected via its exposed die pad 140 to the first chip 11, such that heat generated by the second chip 15 mounted on the die pad 140 can be transmitted to the first chip 11 and then to the solder bumps 12 and the substrate 10 to be dissipated out of the semiconductor package. Such additional heat dissipating path can effectively improve the heat dissipating efficiency of the semiconductor package.

The multi-chip semiconductor package in the second embodiment can be fabricated by the steps similar to those shown in FIGS. 2A to 2E or by a batch method similar to that shown in FIGS. 3A to 3F. The fabrication processes of the semiconductor package in the second embodiment differ from those shown in FIGS. 2A to 2E or FIGS. 3A to 3F in that, after the substrate 10 is provided and the first chip 11 is mounted on the substrate 10 in FIGS. 2A to 2B and FIGS. 3A to 3B, a thermally conductive adhesive 2 is applied on the non-active surface 111 of the first chip 11. Then, a process similar to FIG. 2C or 3C for mounting the preformed package structure 13 on the substrate 10 is performed, wherein the exposed lower surface of the die pad 140 and the first encapsulation body 16 of the preformed package structure 13 are attached to the thermally conductive adhesive 2, making the thermally conductive adhesive 2 fill the gap G between the first chip 11 and the first encapsulation body 16. Subsequently, the processes shown in FIGS. 2D to 2E or FIGS. 3D to 3F are carried out. Since the thermally conductive adhesive 2 is filled in the gap G between the first chip 11 and the first encapsulation body 16 prior to the molding process of FIG. 2D or 3D, the second encapsulation body 17 formed by molding would not fill the gap G. Further as described above, the provision of thermally conductive adhesive 2 facilitates dissipation of heat generated by the second chip 15 in the preformed package structure 13, thereby effectively improving the overall heat dissipating efficiency of the semiconductor package.

The above multi-chip semiconductor package and its fabrication methods according to the present invention allow a substrate to accommodate both a packaged chip and a flip chip. This is accomplished by firstly, electrically connecting a first chip in a flip-chip manner to the substrate via a plurality of solder bumps, and then mounting a preformed package structure on the substrate, wherein the preformed package structure is incorporated with a second chip and has exposed outer leads that are mounted and electrically connected to the substrate by surface mount technology (SMT), such that a first encapsulation body of the preformed package structure, the exposed outer leads and the substrate form a space where the first chip is received, and the first encapsulation body is supported above the first chip, with a gap being present between the first encapsulation body and the first chip. Since the preformed package structure is electrically connected to the substrate by the surface mount technology, the solder bumps located between the first chip and the substrate would not subject to cracks caused by shocks generated during a wire-bonding process in the prior art. Thus, an underfill process is not required in the present invention to fill gaps between the adjacent solder bumps located between the first chip and the substrate. On the other hand, in the present invention, a single molding process is carried out to form a second encapsulation body for encapsulating the first chip and the preformed package structure as well as filling the gap between the first encapsulation body and the first chip and the gaps between the adjacent solder bumps. This can prevent predetermined positions on the substrate for mounting the outer leads of the preformed package structure from contamination by the underfull process, and assure the preformed package structure to be well mounted and electrically connected to the substrate, such that the electrical connection quality and reliability of the entire semiconductor package would not be affected. Moreover, the fabricated preformed package structure before being mounted on the substrate is subjected to a burn-in test. Specifically, only the preformed package structure that has successfully passed the burn-in test would be mounted on the substrate. As a result, the preformed package structure would not contain a second chip that is defective or unknown with its quality, such that the conventional known good die (KGD) problem can be eliminated, and the reliability and yield of the entire semiconductor package are assured. Additionally, in another preferred embodiment of the present invention, a lead frame of the preformed package structure has a die pad exposed from the first encapsulation body, with a lower surface of the die pad abutting against the gap between the first encapsulation body and the first chip, and prior to fabricating the second encapsulation body, a thermally conductive adhesive is applied in the gap between the first encapsulation body and the first chip, such that heat generated by the second chip mounted on the die pad can be transmitted via the die pad and the thermally conductive adhesive to the first chip and then transmitted. via the solder bumps and the substrate to be dissipated out of the semiconductor package. This thus effectively improves the heat dissipating efficiency of the entire semiconductor package. Furthermore, the semiconductor package in the present invention has a multi-chip structure containing at least the first and second chips, thereby providing the entire semiconductor package with enhanced electrical and operational performances.

The present invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

The invention claimed is:

1. A multi-chip semiconductor package, comprising:
a substrate having an upper surface and a lower surface opposed to the upper surface;
at least one first chip having an active surface and a non-active surface, wherein the active surface of the first chip is mounted on and electrically connected to the upper surface of the substrate via a plurality of solder bumps;
a preformed package structure comprising a lead frame, at least one second chip mounted on and electrically connected to the lead frame, and a first encapsulation body for encapsulating the second chip and a portion of the lead frame, with outer leads of the lead frame being exposed from the first encapsulation body and mounted on the upper surface of the substrate, wherein the first encapsulation body, the exposed outer leads and the substrate form a space where the first chip is received, and a gap is present between the non-active surface of the first chip and the first encapsulation body; and
a second encapsulation body formed on the upper surface of the substrate, for encapsulating the first chip, the solder bumps and the preformed package structure,
wherein the gap between the non-active surface of the first chip and the first encapsulation body is filled with a single-layered thermally conductive adhesive disposed between and directly connected to the lead frame and the first chip.

2. The multi-chip semiconductor package of claim 1, further comprising a plurality of solder balls implanted on the lower surface of the substrate.

3. The multi-chip semiconductor package of claim 1, wherein the second chip is electrically connected to the lead frame via a plurality of bonding wires.

4. The multi-chip semiconductor package of claim 3, wherein the lead frame comprises a die pad and a plurality of leads, each of the leads comprising an inner lead and one of the outer leads, such that the second chip is mounted on an upper surface of the die pad and electrically connected to the inner leads, and the inner leads are encapsulated by the first encapsulation body.

5. The multi-chip semiconductor package of claim 4, wherein the gap between the non-active surface of the first chip and the first encapsulation body is filled with the single-layered thermally conductive adhesive, and the die pad is encapsulated by the first encapsulation body.

6. The multi-chip semiconductor package of claim 4, wherein the gap between the non-active surface of the first chip and the first encapsulation body is filled with the single-layered thermally conductive adhesive, and a lower surface of the die pad is exposed from the first encapsulation body and abuts against the single-layered thermally conductive adhesive filling the gap between the first chip and the first encapsulation body.

* * * * *